United States Patent
Futakuchi et al.

(10) Patent No.: US 10,712,370 B2
(45) Date of Patent: Jul. 14, 2020

(54) CURRENT SENSOR

(71) Applicant: Hitachi Metals, Ltd., Tokyo (JP)

(72) Inventors: Naoki Futakuchi, Tokyo (JP); Ken Okuyama, Tokyo (JP); Katsuya Akimoto, Tokyo (JP); Haruyasu Komano, Tokyo (JP); Jun Umetsu, Tokyo (JP); Yujiro Tomita, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 42 days.

(21) Appl. No.: 16/210,549

(22) Filed: Dec. 5, 2018

(65) Prior Publication Data

US 2019/0250193 A1  Aug. 15, 2019

(30) Foreign Application Priority Data

Feb. 13, 2018  (JP) .................... 2018-023592

(51) Int. Cl.
| | |
|---|---|
| *G01R 15/20* | (2006.01) |
| *G01R 33/00* | (2006.01) |
| *G01R 19/15* | (2006.01) |
| *G01R 33/09* | (2006.01) |
| *G01R 33/07* | (2006.01) |
| *G01R 33/025* | (2006.01) |

(52) U.S. Cl.
CPC ......... *G01R 15/205* (2013.01); *G01R 15/207* (2013.01); *G01R 19/15* (2013.01); *G01R 33/0076* (2013.01); *G01R 33/025* (2013.01); *G01R 33/072* (2013.01); *G01R 33/091* (2013.01)

(58) Field of Classification Search
CPC .............. G01R 15/205; G01R 33/0076; G01R 33/025; G01R 33/072; G01R 15/207; G01R 33/091; G01R 19/15; G01R 15/202; G01R 15/20
See application file for complete search history.

(56) References Cited

U.S. PATENT DOCUMENTS

| | | | |
|---|---|---|---|
| 9,915,685 | B2 | 3/2018 | Nomura et al. |
| 2016/0258985 | A1 | 9/2016 | Nomura et al. |
| 2017/0082659 | A1* | 3/2017 | Harada ............... G01R 15/20 |
| 2018/0031613 | A1* | 2/2018 | Nakayama .......... G01R 15/205 |

FOREIGN PATENT DOCUMENTS

JP  2015-194472 A  11/2015

* cited by examiner

*Primary Examiner* — Daniel R Miller
(74) *Attorney, Agent, or Firm* — Roberts Calderon Safran & Cole P.C.

(57) ABSTRACT

A current sensor includes plural bus bars which are each formed rectangular in a cross section, a pair of shield plates that include a magnetic material and are arranged so as to collectively sandwich the plural bus bars therebetween, and plural magnetic detection elements that are each arranged between the bus bars and one of the shield plates. A distance d between a detection position of a magnetic field intensity at an arbitrary one of the magnetic detection elements and a center position in the width direction between one of the bus bars corresponding to the arbitrary magnetic detection element and an other of the bus bars adjacent thereto in the width direction satisfies the following expression: $d/w + 0.023(w/h) \geq 0.36$ where a width of the shield plates is w and an interval along a height direction of the shield plates is h.

11 Claims, 7 Drawing Sheets

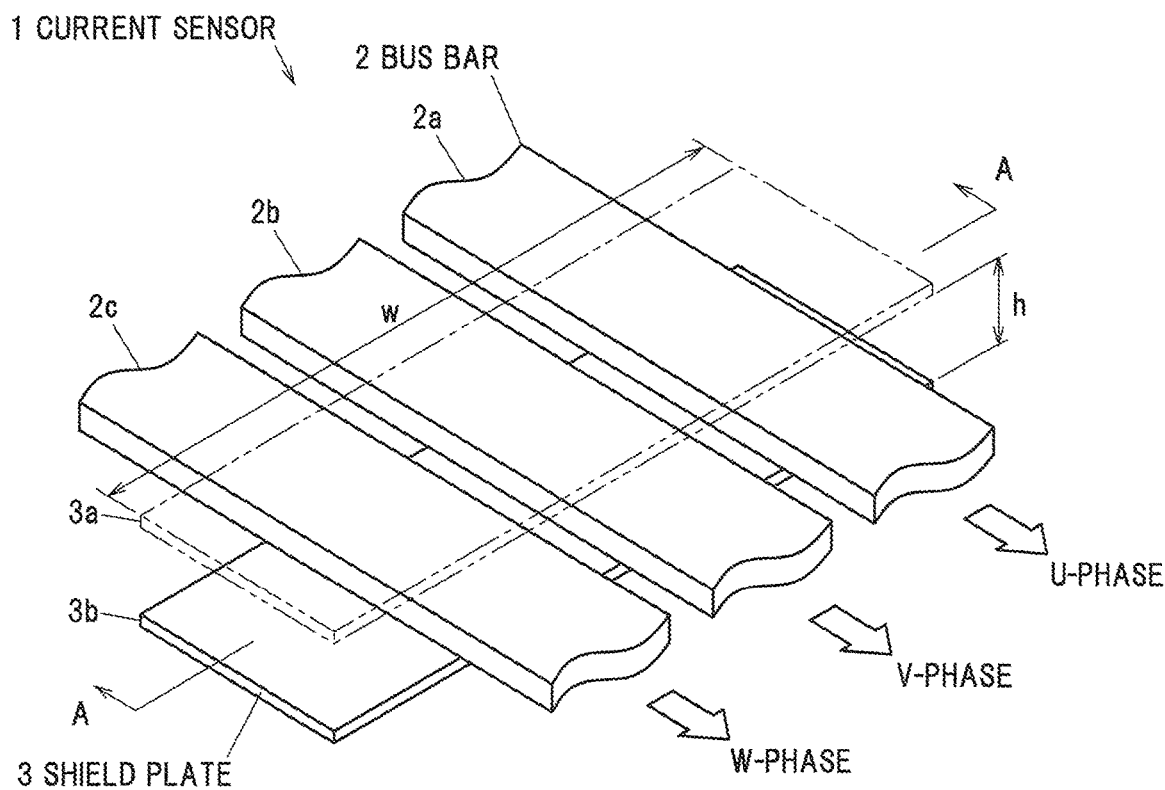
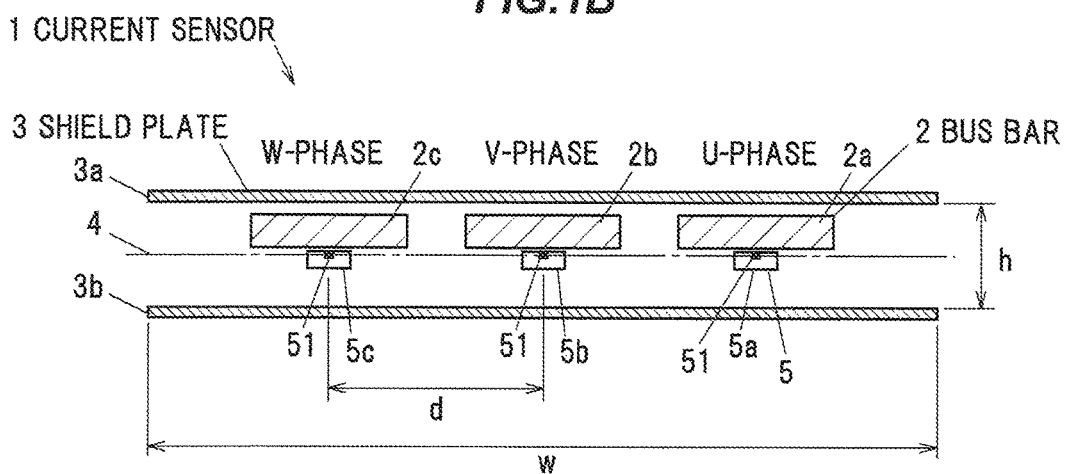

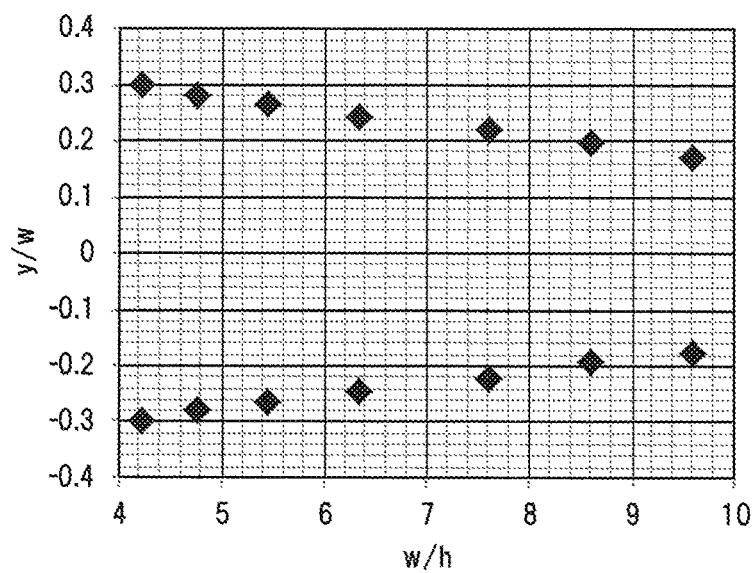
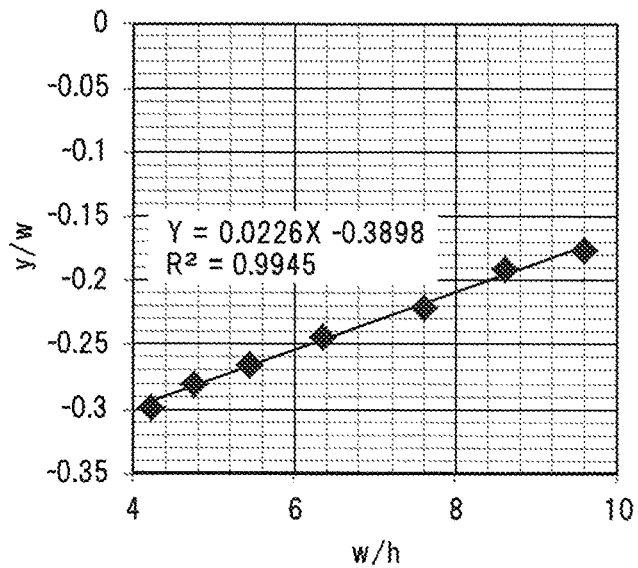
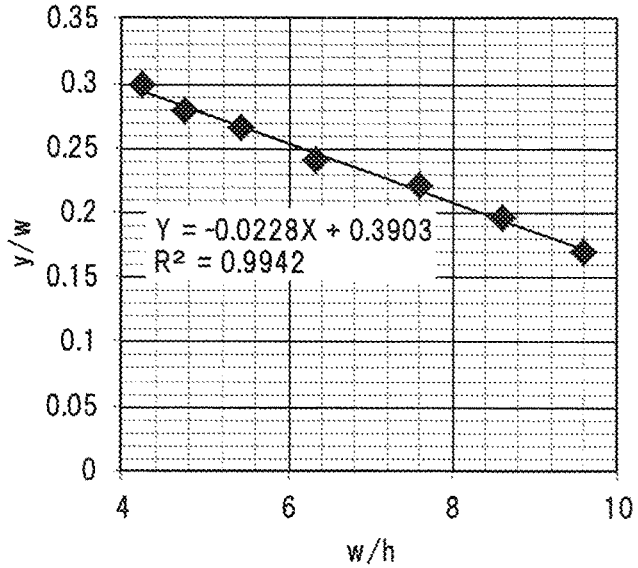

CURRENT SENSOR

CROSS-REFERENCE TO RELATED APPLICATIONS

The present application is based on Japanese patent application No. 2018-023592, the entire contents of which are incorporated herein by reference.

FIELD OF THE INVENTION

The invention relates to a current sensor.

BACKGROUND ART

A current sensor is known which has a magnetic detection element for detecting a magnetic field intensity generated by a current to be measured (e.g., see PTL 1). By detecting the magnetic field intensity by the magnetic detection element, it is possible to calculate the current based on the magnetic field intensity.

PTL 1 discloses a current sensor in which a pair of shield plates are arranged so as to sandwich a bus bar through which a current to be measured flows and a magnetic detection element. The current sensor disclosed in PTL 1 uses a magnetic detection element for detecting a magnetic flux density in the plate width direction of the bus bar, and has a magnetic detection element installed in a non-transmission region where an external magnetic flux in the plate width direction of the bus bar does not transmit. Thereby, an influence of the external magnetic flux is suppressed.

CITATION LIST

Patent Literature

PTL 1: JP 2015/194472 A

SUMMARY OF INVENTION

Technical Problem

The current sensor disclosed in PTL 1 may have a problem that the detection accuracy is lowered by receiving the influence (interference from other layers) of the magnetic field generated in the bus bar other than the bus bar as the current detection target by the magnetic detection element when plural bus bars are arranged between a pair of shield plates.

It is an object of the invention to provide a current sensor that suppresses interference from other phases and improves detection accuracy.

Solution to Problem

According to an embodiment of the invention, a current sensor comprises:

a plurality of bus bars which are each formed rectangular in a cross section and arranged in order to be spaced from each other in a width direction, and through which a current is fed along a length direction perpendicular to the width direction;

a pair of shield plates that comprise a magnetic material and are arranged so as to collectively sandwich the plurality of bus bars therebetween in a height direction perpendicular to the width direction and the length direction; and a plurality of magnetic detection elements that are each arranged between the bus bars and one of the shield plates so as to detect a magnetic field intensity in the width direction, wherein a distance d between a detection position of a magnetic field intensity at an arbitrary one of the magnetic detection elements and a center position in the width direction between one of the bus bars corresponding to the arbitrary magnetic detection element and an other of the bus bars adjacent thereto in the width direction satisfies the following expression:

$$d/w + 0.023(w/h) \geq 0.36$$

where a width of the shield plates is w and an interval along the height direction of the pair of shield plates is h.

Effects of Invention

According to an embodiment of the invention, it is possible to provide a current sensor that suppresses interference from other phases and improves detection accuracy.

BRIEF DESCRIPTION OF DRAWINGS

Next, the present invention will be explained in conjunction with appended drawings, wherein:

FIG. 1A is a perspective view of a first shield plate of a current sensor according to an embodiment of the present invention.

FIG. 1B is a cross sectional view showing current sensor according to an embodiment of the present invention cut along line A-A in FIG. 1A.

FIG. 2A is a graph showing the relationship between y/w and the aspect ratio w/h where the relative intensity is 1%.

FIG. 2B is a graph extracting a region where the y/w is negative.

FIG. 2C is a graph extracting a region where the y/w is positive.

EMBODIMENT

Figure 3:
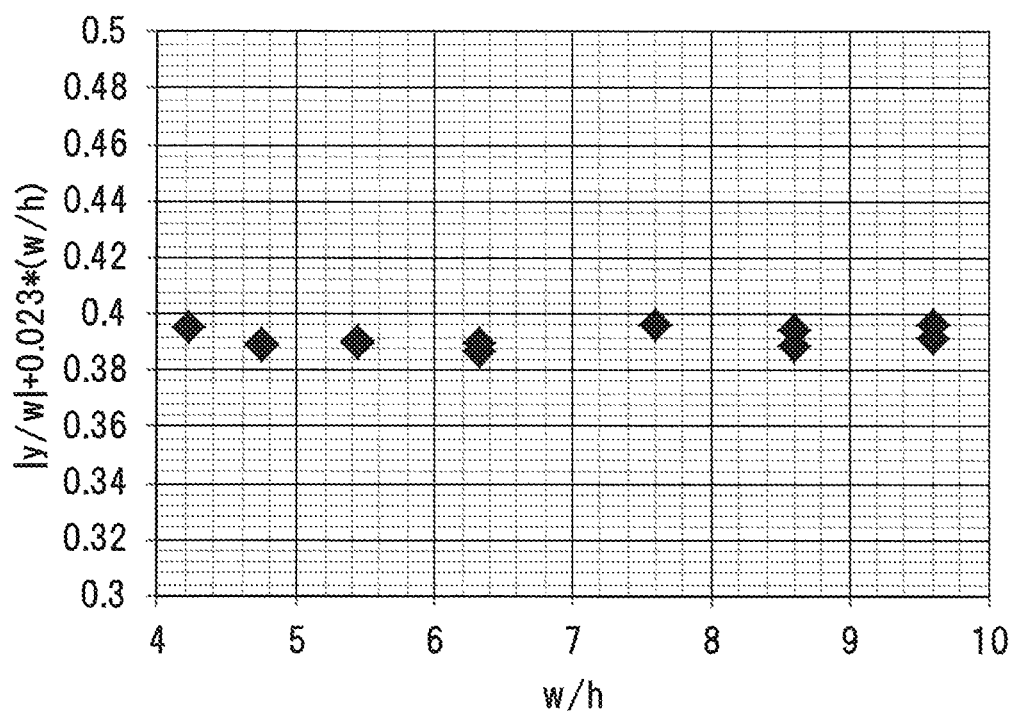
FIG. 3 is a graphical diagram in the case where the vertical axis in FIG. 2A is $|y/w| + 0.023(w/h)$.

An embodiment of the invention will be described in conjunction the drawings.

FIG. 1A is a perspective view of a first shield plate 3a of a current sensor according to an embodiment of the present invention. FIG. 1B is a cross sectional view showing a current sensor according to an embodiment of the present invention cut along line A-A in FIG. 1A. A current sensor 1 has plural bus bars, a pair of shield plates, and plural magnetic detection elements 5 corresponding to each bus bar 2. The bus bar 2 is formed to have a rectangular cross section.

The bus bar 2 is a plate-shaped conductor made of an electrical good conductor such as copper or aluminum, etc., and is a current path through which the current flows. The bus bar 2 is used as a power supply line between a motor and an inverter in, e.g., an electric vehicle or a hybrid vehicle. In the present embodiment, a case where three bus bars 2a to 2c corresponding to three-phase alternating current are used will be described.

Hereinafter, the horizontal direction in FIG. 1B is referred to as a width direction, the vertical direction is referred to as a height direction, and the paper surface direction is referred to as a length direction. The three bus bars 2a to 2c are arranged in order to be spaced apart in a width direction and flows a current along a length direction. In the current sensor 1, the first bus bar 2a, the second bus bar 2b, and the third bus bar 2c are sequentially arranged from one side in the width direction to the other side (from the right side to the left side in FIG. 1B). In each bus bar 2a to 2c, electric current of each phase in three-phase alternating current flows. In the present embodiment, currents of U phase are supplied to the first bus bar 2a, V phase to the second bus bar 2b, and W phase current to the third bus bar 2c.

The shield plate 3 is for shielding a magnetic field from the outside so that a magnetic field from the outside does not affect the detection result of the magnetic detection element 5. The shield plate 3 is made of a magnetic material. The shield plate 3 is formed in a rectangular plate shape having two sides facing each other in the width direction and two sides facing each other in the length direction.

The shield plate 3 is arranged so as to sandwich the three bus bars 2a to 2c all together in the height direction to be spaced from the bus bar 2. The shield plate 3 is arranged so that its surface is parallel to the surface of the bus bar 2 (so that a height direction of the shield plate 3 and a height direction of the bus bar 2 are aligned with each other). The magnetic detection element 5 is arranged between each bus bar 2 and one shield plate 3.

The pair of shield plates 3 are arranged so as to be parallel to each other. However, the pair of shield plates 3 need not be strictly parallel, and some inclination and deflection due to manufacturing tolerance, etc., are allowed. Specifically, the inclination of the other shield plate 3 with respect to one shield plate 3 is preferably not more than 1°.

Hereinafter, the shield plate 3 arranged on the bus bar 2 side will be referred to as a first shield plate 3a, and the shield plate 3 arranged on the magnetic detection element 5 side will be referred to as a second shield plate 3b. A position where the distances from the first and second shield plates 3a and 3b become equal, that is, the center position in the height direction of the space sandwiched between the first and second shield plates 3a and 3b is referred to as an intermediate position 4.

The magnetic detection element 5 is arranged between the bus bars 2a to 2c and the second shield plate 3b, respectively, and detects the magnetic field intensity generated by the current flowing through the bus bars 2a to 2c. For example, a Hall element, a GMR (Giant Magneto Resistive Effect) element, an AMR (Anisotropic Magneto Resistive) element, a TMR Tunneling Magneto Resistive) element, etc., can be used as the magnetic detection element 5. Hereinafter, the magnetic detection element 5 corresponding to the first bus bar 2a is referred to as a first magnetic detection element 5a, the magnetic detection element 5 corresponding to the second bus bar 2b is referred to as a second magnetic detection element 5b, and the magnetic detection element 5 corresponding to the third bus bar 3b is referred to as a third magnetic detection element 5c.

Each of the magnetic detection elements 5a to 5c is configured so as to output a voltage output signal corresponding to the magnetic field intensity (the magnetic flux density) in the direction along the detection axis. In the present embodiment, each of the magnetic detection elements 5a to 5c is arranged so that the detection axis coincides with the width direction of the bus bar 2 (left and right direction in FIG. 1B). That is, each of the magnetic detection elements 5a to 5c detects the magnetic field intensity in the width direction. In FIG. 1B, reference numeral 51 shows a detection position of the magnetic field intensity in the magnetic detection element 5.

Method of Determining the Position of the Magnetic Detection Element 5

In the vicinity of the bus bar 2, the inclination of the direction of the magnetic flux with respect to the height direction is increased, and a width direction component is generated. Therefore, in an arbitrary magnetic detection element 5, in order to suppress the influence of the current flowing through the bus bar 2 (hereinafter referred to as non-corresponding bus bar) other than the corresponding bus bar 2, it is preferable to sufficiently separate the magnetic detection element 5 from the non-corresponding bus bar 2. However, in the vicinity of the end portion of the shield plate 3, since the inclination of the direction of the magnetic flux with respect to the height direction increases, the influence of the current flowing through the non-corresponding bus bar 2 may increase even when the magnetic detection element 5 is separated too far from the non-corresponding bus bar 2.

More specifically, in order to suppress deterioration of detection accuracy without performing interference correction, etc., it is desirable that a ratio (referred to as relative intensity) of the magnetic field intensity (magnetic flux density) detected by the magnetic detection element 5 by the current flowing through the corresponding bus bar 2 to the magnetic field intensity (magnetic flux density) detected by the magnetic detection element 5 by the current flowing through the non-compliant bus bar 2 to is not more than about 1%.

Therefore, when the width w of the shield plate 3 and a distance h along the height direction of the shield plate 3 are changed, a distance d between the non-corresponding bus bar 2 and the magnetic detection element 5, the distance d at which the relative intensity of which is 1%, was found by simulation. The distance d means a distance between the detection position 51 of the magnetic field intensity in the magnetic detection element 5 and the center position in the width direction of the bus bar 2 (non-corresponding bus bar) adjacent in the width direction to the bus bar 2 corresponding to the magnetic detection element 5 (See FIG. 1B). In addition, here, a simulation was carried out in the case of energizing the second bus bar 2b arranged in the center in the width direction. A coordinate y in the width direction has its origin as the width direction center of the second bus bar 2b, the +y direction as the right direction, the -y direction as the left direction. FIG. 2A shows the simulation result when the detection position is set to the intermediate position 4 in the height direction. The "magnetic field intensity (magnetic flux density) detected by the magnetic detection element 5 by the current flowing through the corresponding bus bar 2" is equal to the magnetic field intensity (magnetic flux density) detected by the magnetic detection element 5 when y=0 in this simulation. When the detection position 51 of the magnetic detection element 5 corresponding to the bus bar 2 adjacent to the second bus bar 2b in the width direction is set at the position of the coordinate y, the distance d is equal to the absolute value of y.

In the simulation, the magnetic detection element 5 is arranged so that the intermediate position 4 and the detection position 51 coincide, the intermediate position 4 is a position at which the distances from the first and second shield plates 3a and 3b are equal. Further, the width of the bus bar 2 is 15 mm, the height is 3 mm, the length of the shield plate 3 is 1 mm, the relative permeability is 5000, and the distance between the bus bar 2 and the magnetic detection element 5 in the height direction is 20 mm.

As shown in FIG. 2A, there is a distance d such that the relative intensity is 1% in both the region where the coordinate y is positive and the region where it is negative because the distribution of the magnetic field intensity on the left and right sides in the width direction of the magnetic detection element 5 is substantially symmetrical. In FIG. 2A, a vertical axis is y/w, and the coordinate y is shown as a relative distance to the width w of the shield plate 3. A horizontal axis in FIG. 2A is w/h. This w/h means the aspect ratio of the space sandwiched between the shield plates 3 in a cross sectional view perpendicular to the length direction (hereinafter simply referred to as the aspect ratio w/h).

Looking at the region where the coordinate y is negative in the graph of FIG. 2A, as shown in FIG. 2B, the relationship, at which the relative intensity is 1%, between y/w and w/h is in a substantially proportional relationship. Where y/w is Y and w/h is X, the relationship between them is expressed by the following approximate expression:

$Y=0.0226\ X-0.3898.$

A region (i.e., a region where the absolute value of Y becomes large) below the straight line shown by this approximate expression is a region in which the relative intensity is smaller than 1%, that is, a region in which the influence of the non-corresponding bus bar 2 can be sufficiently suppressed.

Similarly, looking at the region where the coordinate y is positive in the graph of FIG. 2A, as shown in FIG. 2C, the relationship, at which the relative intensity is 1%, between y/w and w/h is in a substantially proportional relationship. Where y/w is Y and w/h is X, the relationship between them is expressed by the following approximate expression:

$Y=-0.0228\ X+0.3903.$

A region (i.e., a region where the absolute value of d becomes large) above the straight line shown by this approximate expression becomes a region where the relative intensity is less than 1%, that is, a region in which the influence of the non-corresponding bus bar 2 can be sufficiently suppressed.

FIG. 3 is a graph in which the approximate expression obtained in FIGS. 2B and 2C is taken into account and the vertical axis in FIG. 2A is |y/w|+0.023 (w/h). It can be seen from FIG. 3 that the relative intensity can be sufficiently reduced and the influence by the current flowing through the non-corresponding bus bar 2 can be sufficiently suppressed when |y/w|+0.023 (w/h) is not less than 0.36.

Accordingly, the current sensor 1 of the present embodiment is configured such that a width w of the shield plate 3, an interval h between the shield plates 3, and a distance d between the detection position 51 of the magnetic detection element 5 and the center position in the width direction of the non-corresponding bus bar 2 satisfy the relationship of the following expression (1):

$$D/w+0.023\ (w/h) \geq 0.36 \quad (1).$$

Here, the absolute value of y is the same as the distance d. d/w+0.023(w/h) is more preferably not less than 0.38 in order to further suppress the influence of the current flowing through the non-compliant bus bar 2. More preferably, d/w+0.023(w/h) is not less than 0.40.

In the case of using three bus bars 2, it is necessary to satisfy the following expression so that the bus bar 2 does not go out from the region sandwiched by the shield plate 3.

$0<d/w \leq 0.5$

The width w of the shield plate 3 is, e.g., not less than 10 mm and is not more than 150 mm. The aspect ratio w/h is, e.g., not less than 1 and is not more than 10.

Figure 4:
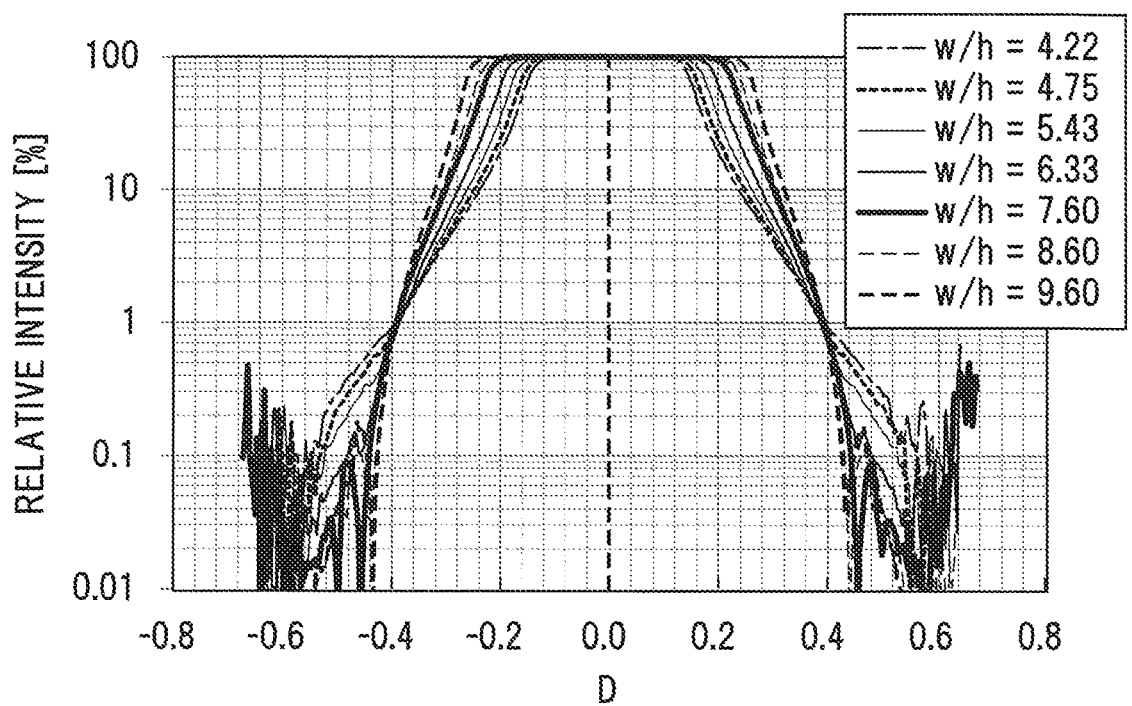
FIG. 4 is a graph showing the relationship between D and the relative intensity when the aspect ratio w/h is changed at the height position of z=0.

FIG. 4 shows the change in the relative intensity when the aspect ratio w/h is changed from 4.22 to 9.60. In FIG. 4, the horizontal axis is D shown by [Expression 1]. The above formula (1) is expressed by $|D| \geq 0.36$ when D is used.

$$D = \begin{cases} \dfrac{y}{w} - 0.023\dfrac{w}{h} & \ldots \ (y<0) \\ 0 & \ldots \ (y=0) \\ \dfrac{y}{w} + 0.023\dfrac{w}{h} & \ldots \ (y>0) \end{cases} \quad \text{[Expression 1]}$$

As shown in FIG. 4, even when the aspect ratio w/h is changed, in the region where |D| is not less than 0.36, the relative intensity is not more than about 1% (about 1.2% at the maximum), and the influence by the current flowing through the non-corresponding bus bar 2 is sufficiently suppressed.

Figure 5A:
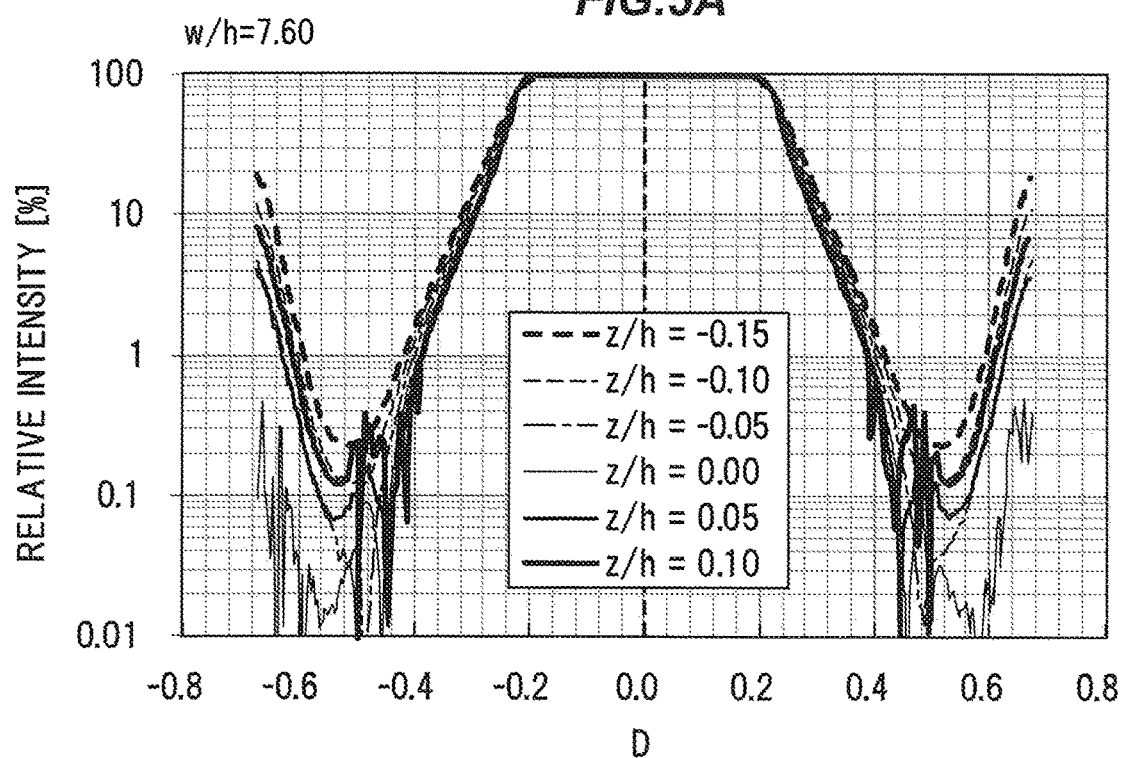
FIG. 5A is a graph showing the relationship between D and relative intensity when z/h is changed with an aspect ratio w/h of 7.60.
Figure 5B:
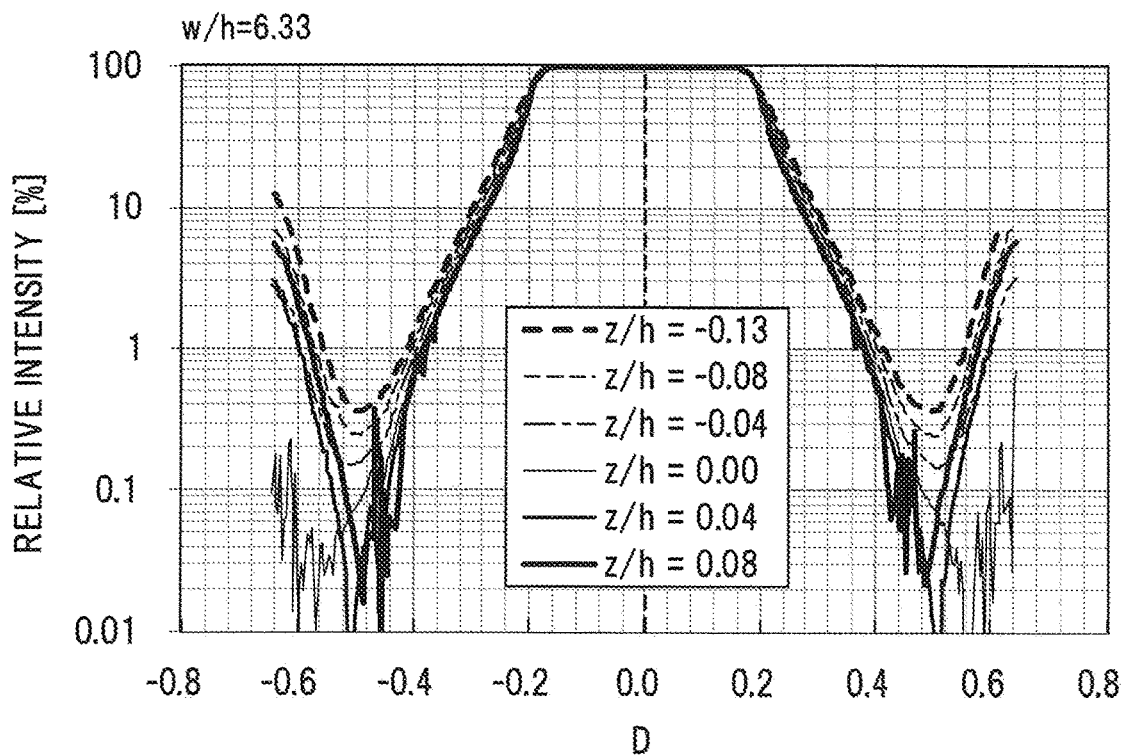
FIG. 5B is a graph showing the relationship between D and relative intensity when z/h is changed with an aspect ratio w/h of 6.33.

Next, a case where the detection position 51 of the magnetic detection element 5 is shifted in the height direction from the intermediate position 4 will be examined. The distance from the intermediate position 4 of the detection position 51 in the height direction toward the first shield plate 3a side (the bus bar 2 side) is defined as z. When the detection position 51 is shifted from the intermediate position 4 toward the first shield plate 3a, the sign of the distance z is plus. When the detection position 51 is shifted from the intermediate position 4 to the second shield plate 3b side, the sign of the distance z is minus. FIGS. 5A and 5B show changes in the relative intensity when the relative distance z/h with respect to the distance h of the shield plate 3 is changed for each case where the aspect ratio w/h is 7.60 or 6.33.

As shown in FIGS. 5A and 5B, when the distance z from the intermediate position 4 of the detection position 51 increases, the relative intensity decreases when |D| increases in the range where |D| is up to about 0.5. However, when |D| exceeds about 0.5, the relative intensity increases when |D| increases. This is because the inclination of the direction of the magnetic flux with respect to the height direction is larger as going away from the intermediate position 4 and the width direction component of the magnetic flux density tends to increase. As shown in FIGS. 5A and 5B, in order to suppress the relative intensity sufficiently low regardless of the influence of the positional shift of the detection position 51, |D| is preferably at least is not more than 0.64. That is, it is preferable to satisfy the following formula:

$0.36 \leq D/w+0.023(w/h) \leq 0.64.$

Further, for the case of FIG. 5A, in order to reduce the relative intensity to less than 0.5%, |D| is more preferably not less than 0.44 and is not more than 0.58. That is, it can be said that it is more preferable to satisfy the following formula:

$0.44 \leq d/w+0.023\ (w/h) \leq 0.58.$

Figure 6A:
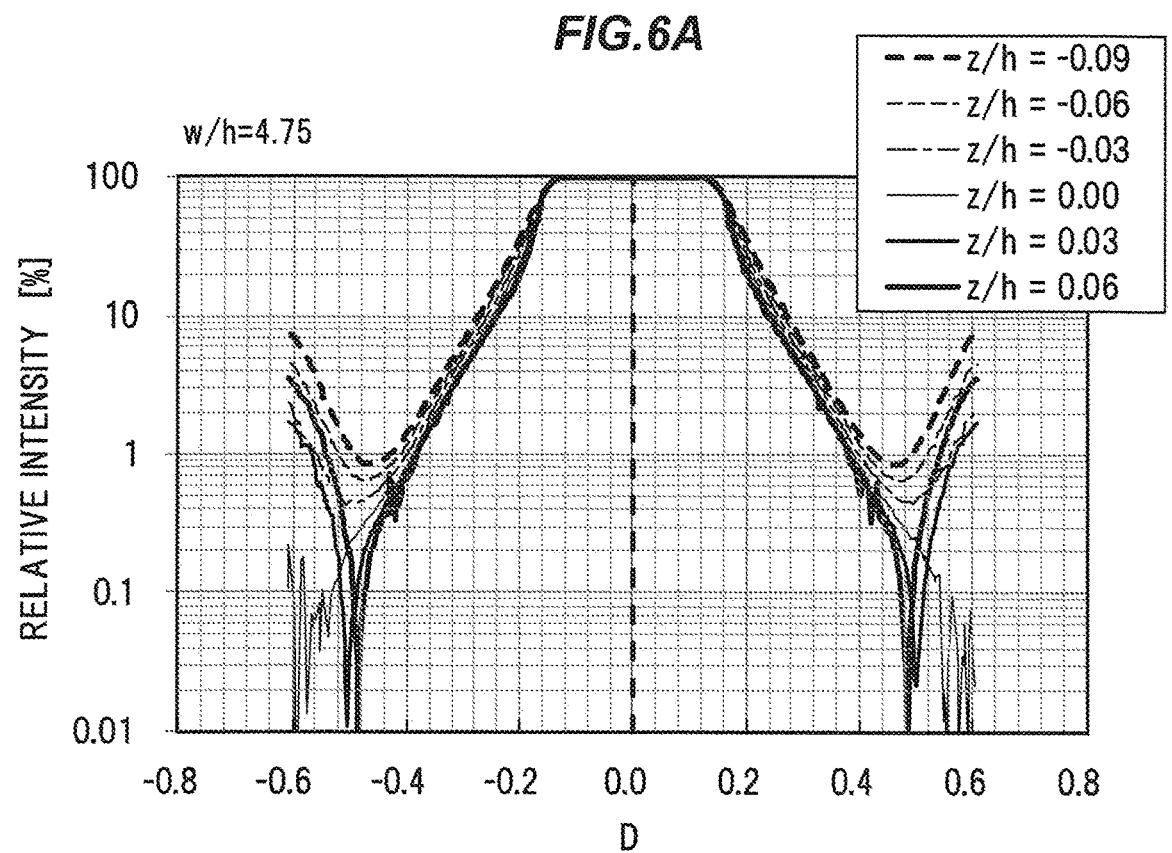
FIG. 6A is a graph showing the relationship between D and relative intensity when z/h is changed with an aspect ratio z/h of 4.75.
Figure 6B:
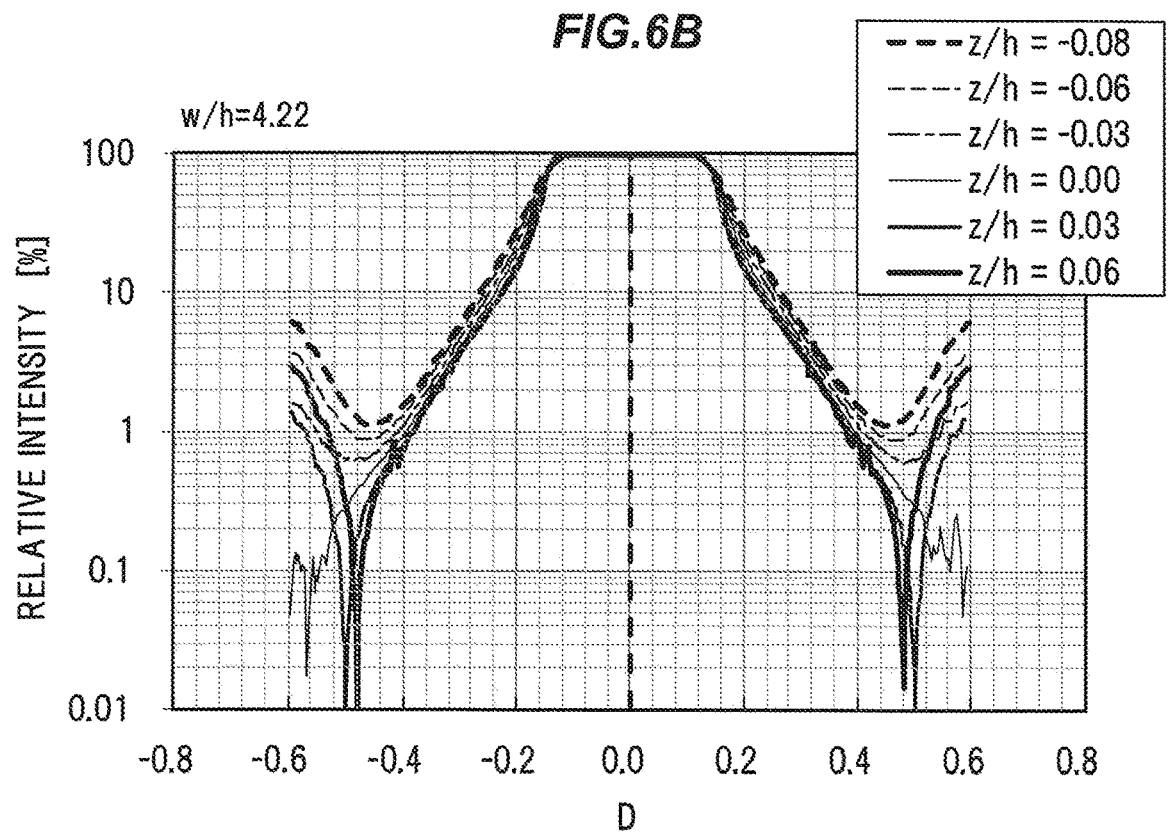
FIG. 6B is a graph showing the relationship between D and relative intensity when z/h is changed with an aspect ratio z/h of 4.22.

FIGS. 6A and 6B show graphs when the aspect ratio w/h is further reduced to 4.75 and 4.22 in FIGS. 5A and 5B. As shown in FIGS. 6A and 6B, the smaller the aspect ratio w/h, the larger the relative intensity with respect to D (the tendency of the region of D where the relative intensity is smaller than 1% becomes smaller), and even when the detection position 51 of the magnetic detection element 5 is shifted slightly, the relative intensity increases.

In FIG. 6A in which the aspect ratio w/h is 4.75, there is a region of D where the relative intensity is not more than 1% when z/h is −0.09. However, in FIG. 6B in which the aspect ratio w/h is 4.22, the relative intensity is not more than 1% even when z/h is −0.08. Therefore, the aspect ratio w/h is preferably larger than at least 4.22, and it is preferable to satisfy the following expression:

$$W/h \geq 4.5.$$

More preferably, the aspect ratio w/h is not less than 4.75.

Considering the trends in the graphs in FIGS. 5A to 6B, the relative intensity with respect to D is smaller (the relative intensity decreases sharply due to the increase of D) when z/h is positive (that is, when the detection position 51 of the magnetic detection element 5 is located closer to the first shield plate 3a than the intermediate position 4) than when z/h is negative (that is, when the detection position 51 of the magnetic detection element 5 is located closer to the second shield plate 3b than the intermediate position 4). Therefore, it is more preferable that the magnetic detection element 5 is arranged so that the detection position 51 of the magnetic field intensity is closer to the first shield plate 3a side (same side as bus bar 2) than the intermediate position 4 or the intermediate position 4. That is, it is more preferable to satisfy the following formula:

$$0 \leq z/h < 0.5.$$

Next, the influence of the relative permeability will be examined. For each case where z/h is −0.10 or +0.10, the change in the relative intensity when changing the relative permeability of the shield plate 3 is obtained by simulation. The simulation results are shown in FIGS. 7A and 7B, respectively.

Figure 7A:
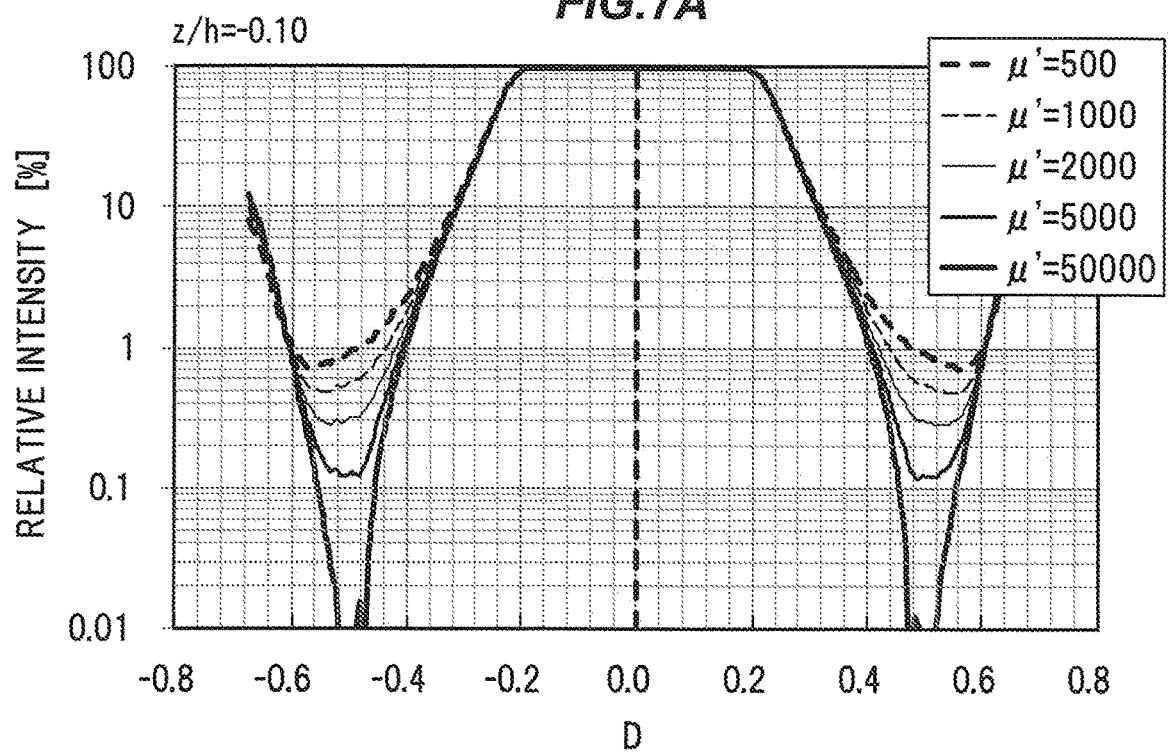
FIG. 7A is a graph showing the relationship between D and relative intensity when a relative magnetic permeability of a shield plate is changed with an aspect ratio z/h of −0.10.
Figure 7B:
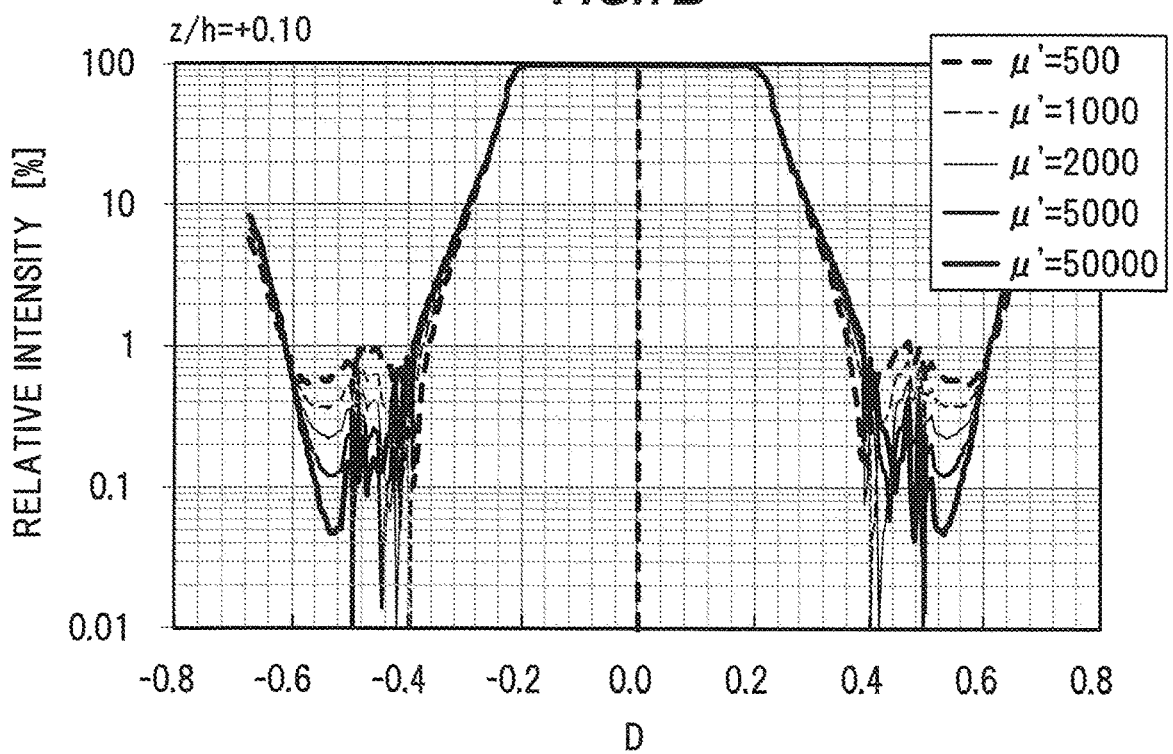
FIG. 7B is a graph showing the relationship between D and relative intensity when a relative magnetic permeability of a shield plate is changed with an aspect ratio z/h of +0.10.

As shown in FIGS. 7A and 7B, as the relative magnetic permeability of the shield plate 3 decreases, there is a tendency that the relative intensity with respect to D tends to increase (the region of D where the relative intensity is smaller than 1% becomes smaller). Therefore, from the simulation results of FIGS. 7A and 7B, the relative magnetic permeability of the shield plate 3 is preferably at least not less than 500, and is preferably not more than 1000.

Effects of the Embodiment

As described above, in the current sensor 1 according to the present embodiment, the distance d between the detection position 51 of the magnetic field intensity in an arbitrary magnetic detection element 5 and a center position in the width direction of the bus bar 2 (non-corresponding bus bar 2) adjacent to a bus bar 2 corresponding to the magnetic detection element 5 in the width direction satisfies the following expression (1), when a width of the shield plate 3 is w, and an interval along the height direction of the pair of shield plates 3 is h.

$$d/w + 0.023(w/h) \geq 0.36 \qquad (1)$$

Accordingly, it is possible to sufficiently suppress the influence of the current flowing through the non-corresponding bus bar 2, and it is possible to realize the current sensor 1 that suppresses interference from other phases and improves detection accuracy. By appropriately selecting the short distance d and the width w of the shield plate 3 that satisfy the above formula (1), it is possible to realize a small current sensor 1 while suppressing interference from other phases. Furthermore, according to the present embodiment, complicated correction such as interference correction, etc., becomes unnecessary, so that an inexpensive current sensor 1 can be realized.

Modification

Figure 8:
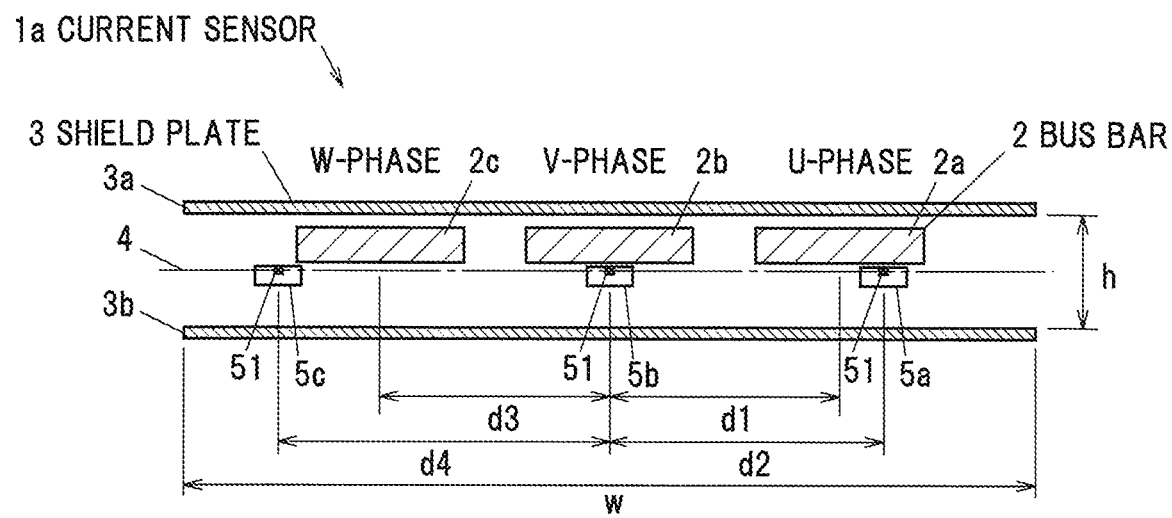
FIG. 8 is a cross sectional view of a current sensor according to a modified example of the present invention.

In the above embodiment, the center position in the width direction of the bus bar 2 and the detection position 51 of the magnetic detection element 5 corresponding to the bus bar 2 face each other in the height direction, but the present invention is not limited thereto and the center position in the width direction of the bus bar 2 and the detection position 51 of the magnetic detection element 5 corresponding to the bus bar 2 may not face each other in the height direction like the current sensor 1a shown in FIG. 8. In FIG. 8, as an example, only the center position in the width direction of the second bus bar 2b and the detection position 51 of the second magnetic detection element 5b face in the height direction, the center position in the width direction of the first and third bus bars 2a and 2c and the detection position 51 of the first and third magnetic detection elements 5a and 5c does not face in the height direction.

FIG. 8 shows d1 as the distance between the detection position 51 of the second magnetic detection element 5b and the center position in the width direction of the first bus bar 2a, d2 as the distance between the detection position 51 of the second magnetic detection element 5a and the center position in the width direction of the first bus bar 2b, d3 as the distance between the detection position 51 of the second magnetic detection element 5b and the center position in the width direction of the first bus bar 2c, d4 as the distance between the detection position 51 of the second magnetic detection element 5c and the center position in the width direction of the first bus bar 2b. When these distances d1 to d4 satisfy the above expression (1) respectively, interference from other phases is suppressed in all the magnetic detection elements 5a to 5c, and it is possible to detect with high accuracy. The distances d1 to d4 are not necessarily the same value and may be different from each other. Further, the detection position of the magnetic detection element 5 may be shifted to either the left or the right in the width direction with respect to the width direction center position of the corresponding bus bar 2.

When the center position in the width direction of the bus bar 2 faces the detection position 51 of the magnetic detection element 5 corresponding to the bus bar 2, the magnetic field (the magnetic field generated by the current flowing through the corresponding bus bar 2) detected by the magnetic detection element 5 is the largest. Therefore, from the viewpoint of improving the accuracy, it is more preferable that the detection position 51 and the center position in the width direction of the corresponding bus bar 2 correspond to the height direction in all the magnetic detection elements 5.

Figure 9:
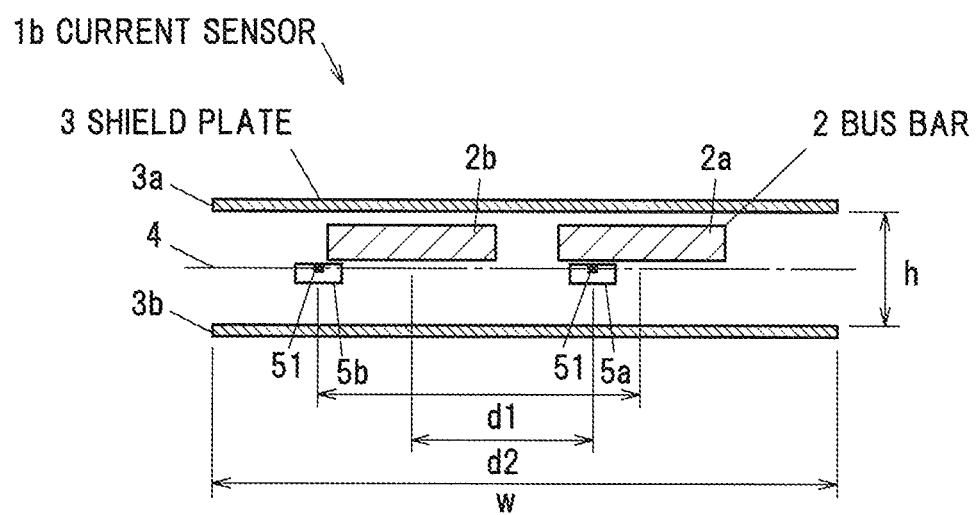
FIG. 9 is a cross-sectional view of a current sensor according to a modified example of the present invention.

Further, in the above-described embodiment, the case where three bus bars 2 are provided is described, but the number of the bus bars 2 may be two or more than four like the current sensor 1b shown in FIG. 9. FIG. 9 shows d1 as the distance between the detection position 51 of the second magnetic detection element 5b and the center position in the width direction of the first bus bar 2a, and d2 as the distance between the detection position 51 of the second magnetic detection element 5a and the center position in the width direction of the first bus bar 2b. When these distances d1 and d2 satisfy the above formula (1), interference from other phases is suppressed in all the magnetic detection elements 5a and 5b, and it is possible to detect with high accuracy.

SUMMARY OF THE EMBODIMENTS

Next, the technical concept that is ascertained from the embodiments described above will be described with the aid of the reference characters and the like in the embodiment. It should be noted, however, that each of the reference characters in the following description should not be construed as limiting the constituent elements in the claims to the members and the like specifically shown in the embodiments.

[1] A current sensor (1), comprises: a plurality of bus bars (2) that are each formed rectangular in a cross section and arranged in order to be spaced from each other in a width direction, and through which a current is fed along a length direction perpendicular to the width direction; a pair of shield plates (3) that comprise a magnetic material and are arranged so as to collectively sandwich the plurality of bus bars (2) therebetween in a height direction perpendicular to the width direction and the length direction; and a plurality of magnetic detection elements (5) that are each arranged between the bus bars (2) and one of the shield plates (3) so as to detect a magnetic field intensity in the width direction, wherein a distance between a detection position (51) of a magnetic field intensity at an arbitrary one of the magnetic detection elements (5) and a center position in the width direction between one of the bus bars (2) corresponding to the arbitrary magnetic detection element (5) and an other of the bus bars adjacent to thereto in the width direction satisfies the following expression:

$$d/w + 0.023(w/h) \geq 0.36$$

where a width of the shield plates (3) is w and an interval along the height direction of the pair of shield plates (3) is h.

[2] The current sensor (1) according to [1], wherein the distance d satisfies the following expression:

$$0.36 \leq d/w + 0.023(w/h) \leq 0.64.$$

[3] The current sensor (1) according to [1] or [2], wherein the pair of shield plates (3) comprise a first shield plate (3a) arranged on a side of the bus bars (2) and a second shield plate (3b) arranged on a side of the magnetic detection elements (5), wherein the bus bars (2) is arranged so that a center position in the height direction is located closer to the first shield plate (3a) than an intermediate position (4) where distances from the first and second shield plates (3a,3b) become equal, and wherein the magnetic detection elements (5) are arranged so that the detection position (51) of the magnetic field intensity is located at the intermediate position (4) or closer to the first shield plate (3) than the intermediate position (4).

[4] The current sensor (1) according to any one of [1] to [3], wherein the width w of the shield plates (3) and the distance h along the height direction of the pair of shield plates (3) satisfy the following equation:

$$w/h \geq 4.5.$$

[5] The current sensor (1) according to any one of [1] to [4], wherein a relative magnetic permeability of the shield plates (3) is not less than 1000.

Although, the embodiments of the invention have been described, the invention is not to be limited to the embodiments. Meanwhile, it should be noted that all combinations of the features described in the embodiments are not necessary to solve the problem of the invention. Also, the various kinds of modifications can be implemented without departing from the gist of the invention.

The invention claimed is:

1. A current sensor, comprising:
   a plurality of bus bars which are each formed rectangular in a cross section and arranged in order to be spaced from each other in a width direction, and through which a current is fed along a length direction perpendicular to the width direction;
   a pair of shield plates that comprise a magnetic material and are arranged so as to collectively sandwich the plurality of bus bars therebetween in a height direction perpendicular to the width direction and the length direction; and
   a plurality of magnetic detection elements that are each arranged between the bus bars and one of the shield plates so as to detect a magnetic field intensity in the width direction,
   wherein a distance d between a detection position of a magnetic field intensity at an arbitrary one of the magnetic detection elements and a center position in the width direction between one of the bus bars corresponding to the arbitrary magnetic detection element and an other of the bus bars adjacent thereto in the width direction satisfies the following expression:

$$d/w + 0.023 \ (w/h) \geq 0.36$$

where a width of the shield plates is w and an interval along the height direction of the pair of shield plates is h.

2. The current sensor according to claim 1, wherein the distance d satisfies the following expression:

$$0.36 \leq d/w + 0.023(w/h) \leq 0.64.$$

3. The current sensor according to claim 1, wherein the pair of shield plates comprise a first shield plate arranged on a side of the bus bars and a second shield plate arranged on a side of the magnetic detection elements,
   wherein the bus bars are arranged so that a center position in the height direction is located closer to the first shield plate than an intermediate position where distances from the first and second shield plates become equal, and
   wherein the magnetic detection elements are arranged so that the detection position of the magnetic field intensity is located at the intermediate position or closer to the first shield plate than the intermediate position.

4. The current sensor according to claim 1, wherein the width w of the shield plates and the distance h along the height direction of the pair of shield plates satisfy the following equation:

$$w/h \geq 4.5.$$

5. The current sensor according to claim 1, wherein a relative magnetic permeability of the shield plates is not less than 1000.

6. The current sensor according to claim 2, wherein the pair of shield plates comprise a first shield plate arranged on a side of the bus bars and a second shield plate arranged on a side of the magnetic detection elements,
   wherein the bus bars are arranged so that a center position in the height direction is located closer to the first shield plate than an intermediate position where distances from the first and second shield plates become equal, and wherein the magnetic detection elements are arranged so that the detection position of the magnetic field intensity is located at the intermediate position or closer to the first shield plate than the intermediate position.

7. The current sensor according to claim 2, wherein the width w of the shield plates and the distance h along the height direction of the pair of shield plates satisfy the following equation:

$$w/h \geq 4.5.$$

8. The current sensor according to claim 3, wherein the width w of the shield plates and the distance h along the height direction of the pair of shield plates satisfy the following equation:

$$w/h \geq 4.5.$$

9. The current sensor according to claim 2, wherein a relative magnetic permeability of the shield plates is not less than 1000.

10. The current sensor according to claim 3, wherein a relative magnetic permeability of the shield plates is not less than 1000.

11. The current sensor according to claim 4, wherein a relative magnetic permeability of the shield plates is not less than 1000.

* * * * *